United States Patent
Choi

(10) Patent No.: US 9,515,654 B2
(45) Date of Patent: Dec. 6, 2016

(54) SEMICONDUCTOR APPARATUS

(71) Applicant: SK hynix Inc., Icheon-si Gyeonggi-do (KR)

(72) Inventor: Young Geun Choi, Icheon-si (KR)

(73) Assignee: Sk hynix Inc., Icheon-si, Gyeonggi-do (KR)

( * ) Notice: Subject to any disclaimer, the term of this patent is extended or adjusted under 35 U.S.C. 154(b) by 35 days.

(21) Appl. No.: 14/242,276

(22) Filed: Apr. 1, 2014

(65) Prior Publication Data

US 2015/0091619 A1  Apr. 2, 2015

(30) Foreign Application Priority Data

Sep. 30, 2013 (KR) .................. 10-2013-0116266

(51) Int. Cl.
- H03B 1/00 (2006.01)
- H03K 3/00 (2006.01)
- H03K 19/00 (2006.01)

(52) U.S. Cl.
CPC .................... *H03K 19/00* (2013.01)

(58) Field of Classification Search
CPC ............... H03K 19/00361; H03K 19/00315; H03K 17/063; H04L 25/0278; H04L 25/0269
USPC ............................................. 327/108–112
See application file for complete search history.

(56) References Cited

U.S. PATENT DOCUMENTS

| | | | | |
|---|---|---|---|---|
| 6,111,447 A | * | 8/2000 | Ternullo, Jr. | G06F 1/08 327/165 |
| 7,479,820 B2 | * | 1/2009 | Okamoto | G11C 5/145 327/535 |
| 7,545,199 B2 | * | 6/2009 | Lee | G11C 5/145 327/530 |
| 8,614,598 B2 | * | 12/2013 | Miyazaki | 327/309 |
| 2004/0108521 A1 | * | 6/2004 | Lim | G11C 11/406 257/200 |
| 2014/0219036 A1 | * | 8/2014 | Kim et al. | 365/189.02 |

FOREIGN PATENT DOCUMENTS

KR  1020080032970 A  4/2008

\* cited by examiner

*Primary Examiner* — Lincoln Donovan
*Assistant Examiner* — Diana J Cheng
(74) *Attorney, Agent, or Firm* — William Park & Associates Ltd.

(57) ABSTRACT

A semiconductor apparatus include a signal level switching decision unit and a transmitter unit. The signal level switching decision unit generates a switching control signal according to off-current of transistors included therein. The transmitter unit outputs a transmitter input signal as a transmitter output signal in response to a switching control signal.

17 Claims, 4 Drawing Sheets

SEMICONDUCTOR APPARATUS

CROSS-REFERENCE TO RELATED APPLICATION

The present application claims priority under 35 U.S.C. §119(a) to Korean application number 10-2013-0116266 filed on Sep. 30, 2013, in the Korean Intellectual Property Office, which is incorporated by reference herein in its entirety.

BACKGROUND

1. Technical Field

Various embodiments relate generally to a semiconductor integrated circuit, and more particularly to a semiconductor apparatus.

2. Related Art

Circuits in a semiconductor apparatus communicates with one another by transmitting and receiving signals.

A circuit that can be used to transmit a signal is referred to as a transmitter circuit and a circuit that can be used to receive a signal transmitted from the transmitter circuit is referred to as a receiver circuit.

Generally the transmitter circuit and the receiver circuit use signal lines (e.g., metal lines) to transmit and receive electrical signals. The longer the length of the signal line is, the stronger its signal strength needs to be. In circumstances where the signal line is long, a transistor having a high drivability is used in a transmitter circuit in order to output electrically stronger signals. However, such high-drivability transistors generally consume a large amount of current because there is a large amount of off-current in the high-drivability transistor.

SUMMARY

In an embodiment of the present invention, a semiconductor apparatus may include a transmitter unit configured to output a transmitter input signal as a transmitter output signal in response to a switching control signal; and a receiver unit configured to output the transmitter output signal as a receiver output signal.

In an embodiment of the present invention, a semiconductor apparatus may include a driver configured to comprise a first transistor and a second transistor; a signal level switching decision unit configured to comprise a third transistor and a fourth transistor, both of which are copied from the first transistor and the second transistor, compare drivability of the third transistor with drivability of the fourth transistor and generate a switching control signal; and a first signal level switching unit configured to invert a transmitter input signal and output the inverted transmitter input signal to the driver or output the transmitter input signal without inversion to the driver in response to the switching control signal.

In an embodiment of the present invention, a semiconductor apparatus may include a first signal level switching unit configured to output a transmitter input signal as a first switching signal in response to a switching control signal; a driver configured to drive the first switching signal and output the first switching signal as a transmitter output signal; a second signal level switching unit configured to output the transmitter output signal as a second switching signal in response to the switching control signal; and a receiver configured to receive the second switching signal and output the second switching signal as a receiver output signal, wherein the second signal level switching unit inverts the transmitter output signal and outputs the inverted transmitter output signal as the second switching signal in response to the switching control signal when the first signal level switching unit inverts the transmitter input signal and outputs the inverted transmitter input signal as the first switching signal in response to the switching control signal, and wherein the second signal level switching unit outputs the transmitter output signal without inversion as the second switching signal in response to the switching control signal when the first signal level switching unit outputs the transmitter input signal without inversion as the first switching signal in response to the switching control signal.

BRIEF DESCRIPTION OF THE DRAWINGS

Features, aspects, and embodiments are described in conjunction with the attached drawings, in which.

DETAILED DESCRIPTION

Hereinafter, a semiconductor device and a system including the same according to the present disclosure will be described below with reference to the accompanying drawings through embodiments.

Figure 1:
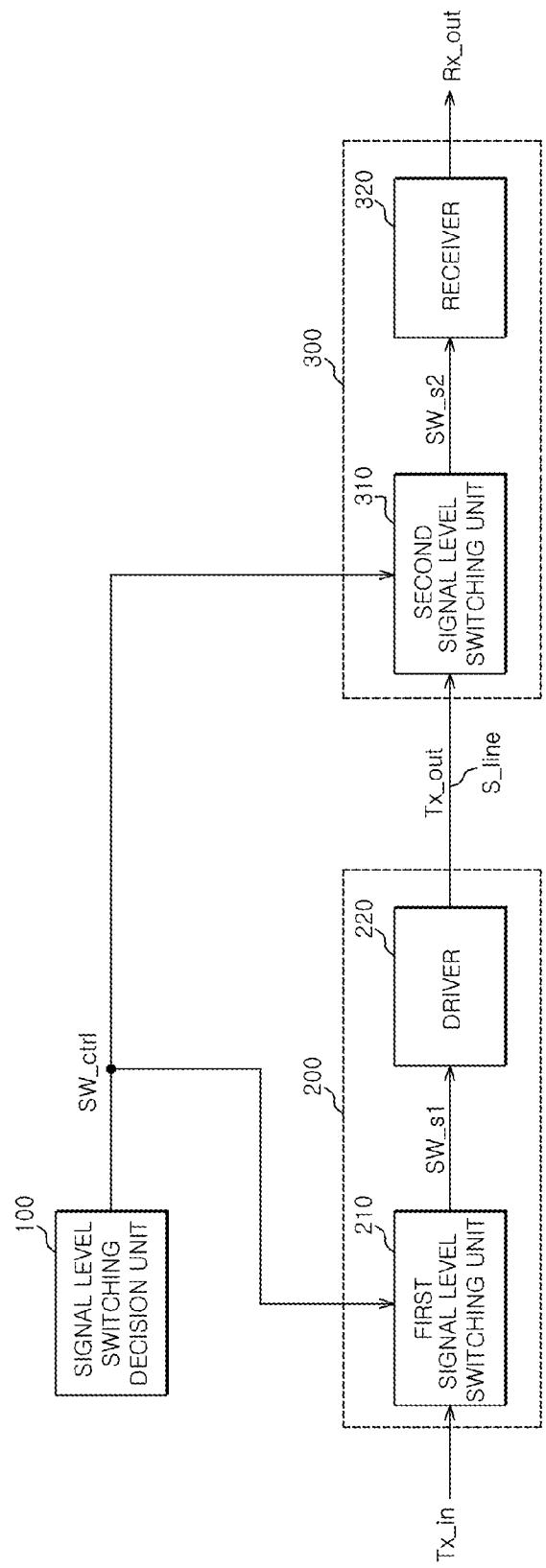
FIG. 1 is a block diagram illustrating a semiconductor apparatus in accordance with an embodiment of the present invention.

Referring to FIG. 1, the semiconductor apparatus in accordance with an embodiment of the present invention may include a signal level switching decision unit 100, a transmitter unit 200 and a receiver unit 300.

The signal level switching decision unit 100 may generate a switching control signal SW_ctrl. Even when a transistor is in an "off" state, leakage current may occur. This leakage current may be referred to as off-current. The switching control signal SW_ctrl may be determined according to whose off-current is larger between transistors included in the signal level switching decision unit 100. In an embodiment of the present invention, off-current of a transistor may be inferred from drivability of the transistor.

The transmitter unit 200 may output a transmitter output signal Tx_out in response to a transmitter input signal Tx_in and the switching control signal SW_ctrl. In an embodiment of the present invention, the transmitter unit 200 may output the transmitter input signal Tx_in or a signal different from the transmitter input signal Tx_in as the transmitter output signal Tx_out in response to the switching control signal SW_ctrl. For example, the transmitter unit 200 may output the transmitter input signal Tx_in without inversion as the transmitter output signal Tx_out or may invert the transmitter input signal Tx_in and output the inverted transmitter input signal Tx_in as the transmitter output signal Tx_out in response to the switching control signal SW_ctrl. For example, the transmitter unit 200 may invert the transmitter input signal Tx_in and output the inverted transmitter input signal Tx_in as the transmitter output signal Tx_out when the switching control signal SW_ctrl is enabled. The transmitter unit 200 may output the transmitter input signal Tx_in without inversion as the transmitter output signal Tx_out when the switching control signal SW_ctrl is disabled.

The transmitter unit 200 may include a first signal level switching unit 210 and a driver 220.

The first signal level switching unit 210 may invert the transmitter input signal Tx_in and output the inverted transmitter input signal Tx_in as a first switching signal SW_s1 or may output the transmitter input signal Tx_in without inversion as the first switching signal SW_s1 in response to the switching control signal SW_ctrl. For example, the first signal level switching unit 210 may invert the transmitter input signal Tx_in and output the inverted transmitter input signal Tx_in as the first switching signal SW_s1 when the switching control signal SW_ctrl is enabled. The first signal level switching unit 210 may output the transmitter input signal Tx_in without inversion as the first switching signal SW_s1 when the switching control signal SW_ctrl is disabled.

The driver 220 may drive the first switching signal SW_s1 and transmit the first switching signal SW_s1 as the transmitter output signal Tx_out to the receiver unit 300 through a signal line S_line.

The receiver unit 300 may output a receiver output signal Rx_out in response to the transmitter output signal Tx_out and the switching control signal SW_ctrl. In an embodiment of the present invention, the receiver unit 300 may output the transmitter output signal Tx_out or a signal different from the transmitter output signal Tx_out as the receiver output signal Rx_out in response to the switching control signal SW_ctrl. For example, the receiver unit 300 may invert the transmitter output signal Tx_out and output the inverted transmitter output signal Tx_out as the receiver output signal Rx_out or may output the transmitter output signal Tx_out without inversion as the receiver output signal Rx_out in response to the switching control signal SW_ctrl. For example, the receiver unit 300 may invert the transmitter output signal Tx_out and output the inverted transmitter output signal Tx_out as the receiver output signal Rx_out when the switching control signal SW_ctrl is enabled. The receiver unit 300 may output the transmitter output signal Tx_out without inversion as the receiver output signal Rx_out when the switching control signal SW_ctrl is disabled.

The receiver unit 300 may include a second signal level switching unit 310 and receiver 320.

The second signal level switching unit 310 may invert the transmitter output signal Tx_out and output the inverted transmitter output signal Tx_out as a second switching signal SW_s2 or may output the transmitter output signal Tx_out without inversion as the second switching signal SW_s2 in response to the switching control signal SW_ctrl. For example, the second signal level switching unit 310 may invert the transmitter output signal Tx_out and output the inverted transmitter output signal Tx_out as the second switching signal SW_s2 when the switching control signal SW_ctrl is enabled. The second signal level switching unit 310 may output the transmitter output signal Tx_out without inversion as the second switching signal SW_s2 when the switching control signal SW_ctrl is disabled.

The receiver 320 may receive the second switching signal SW_s2 and output the second switching signal SW_s2 as a receiver output signal Rx_out.

Figure 2:
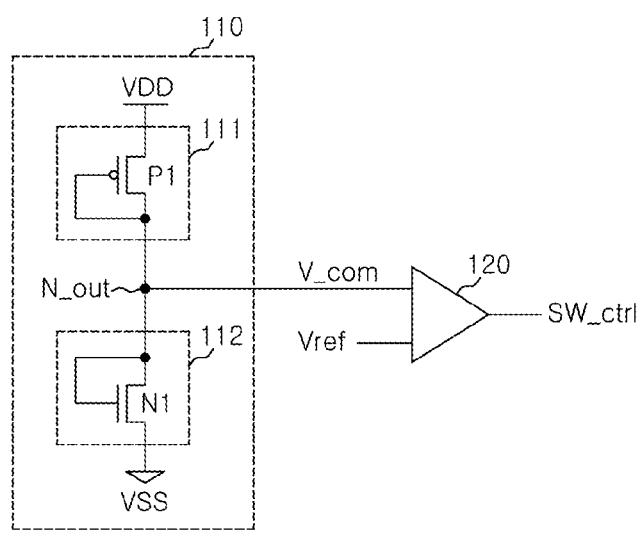
FIG. 2 is a block diagram illustrating a signal level switching decision unit of FIG. 1.

Referring to FIG. 2, the signal level switching decision unit 100 may include a comparison voltage generation unit 110 and a comparison unit 120.

The comparison voltage generation unit 110 may generate a comparison voltage V_com. The comparison voltage V_com may be determined according to whose off-current is larger between two diode-connected transistors in the comparison voltage generation unit 110. In an embodiment of the present invention, off-current of a transistor may be inferred from drivability of the transistor.

The comparison voltage generation unit 110 may include a pull-up unit 111 and a pull-down unit 112.

The pull-up unit 111 may include a first transistor P1 which pulls up a voltage level of an output node N_out. The pull-up unit 111 may increase a voltage level of the output node N_out if a threshold voltage level of the first transistor P1 is not enough to minimize off-current, and therefore a certain amount of off-current is generated enough to pull up the voltage level of the output node N_out. The pull-up unit 111 may include a diode-connected transistor, e.g., the first transistor P1 which has a diode connection between an external voltage VDD and the output node N_out. For example, the first transistor P1 of the pull-up unit 111 may be a PMOS transistor. A source of the first transistor P1 may be coupled to the external voltage VDD and a gate and a drain of the first transistor P1 may be coupled to the output node N_out.

The pull-down unit 112 may include a second transistor N1 which pulls down a voltage level of an output node N_out. The pull-down unit 112 may decrease the voltage level of the output node N_out if a threshold voltage level of the second transistor N1 is not enough to minimize off-current, and therefore a certain amount of off-current is generated enough to pull down the voltage level of the output node N_out. The pull-down unit 112 may include a diode-connected transistor, e.g., the second transistor N1 which has a diode connection between the output node N_out and a ground voltage VSS. For example, the second transistor N1 of the pull-down unit 112 may be a NMOS transistor. A gate and a drain of the second transistor N1 may be coupled to the output node N_out and a source of the second transistor N1 may be coupled to the ground voltage VSS.

The comparison unit 120 may compare a voltage level of the comparison voltage V_com with a reference voltage Vref and generate the switching control signal SW_ctrl.

Figure 3:
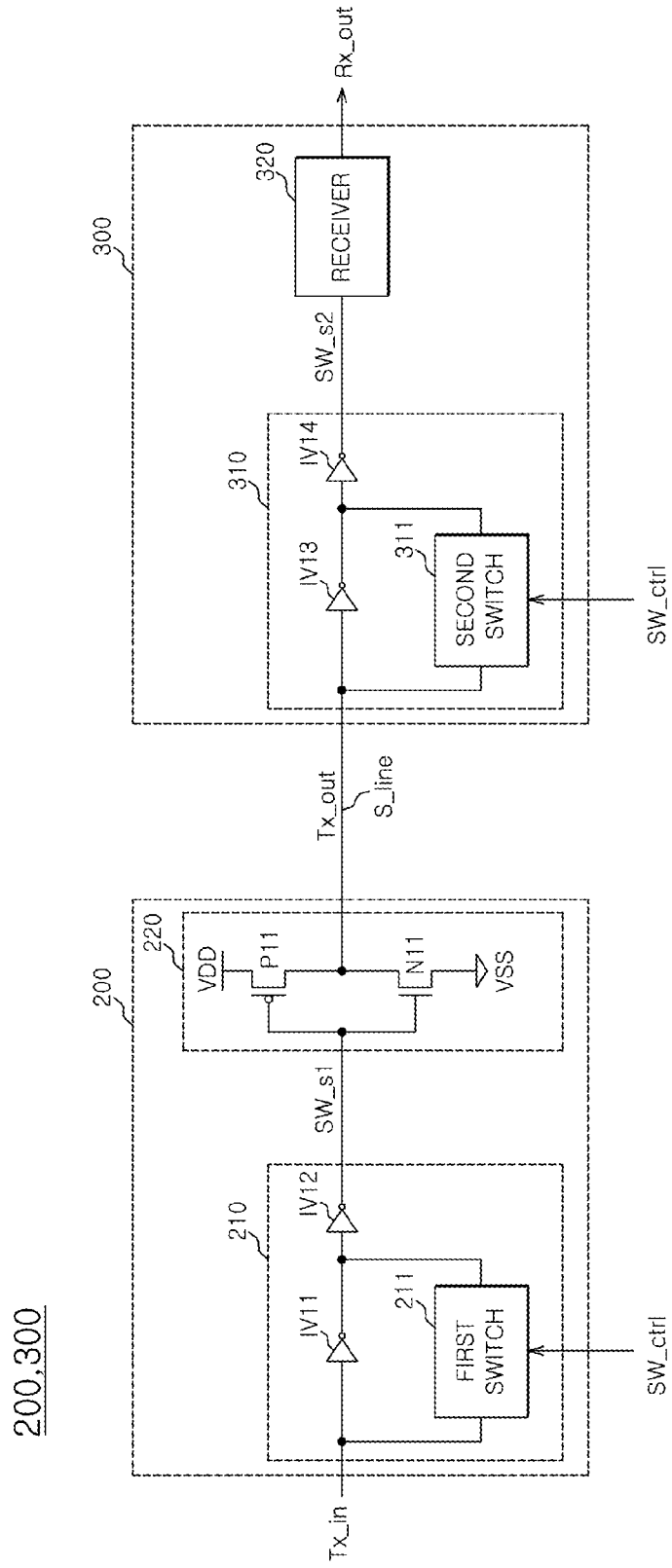
FIG. 3 is a block diagram illustrating a transmitter unit and a receiver unit of FIG. 1.

Referring to FIG. 3, the transmitter unit 200 may include the first signal level switching unit 210 and the driver 220 and the receiver unit 300 may include the second signal level switching unit 310 and the receiver 320.

The first signal level switching unit 210 may invert the transmitter input signal Tx_in and output the inverted transmitter input signal Tx_in as the first switching signal SW_s1 when the switching control signal SW_ctrl is enabled. The first signal level switching unit 210 may output the transmitter input signal Tx_in without inversion as the first switching signal SW_s1 when the switching control signal SW_ctrl is disabled.

The first signal level switching unit 210 may include first and second inverters IV11 and IV12 and a first switch 211. The first inverter IV11 may receive the transmitter input signal Tx_in. The first switch 211 may be coupled between input and output terminals of the first inverter IV11 and may transfer the transmitter input signal Tx_in to the second inverter IV12 when the first switch 211 is turned on. The second inverter IV12 may receive a signal of a node to which the output terminal of the first inverter IV11 and an output terminal of the first switch 211 are commonly coupled and output the signal as the first switching signal SW_s1.

The driver 220 may include first and second transistors P11 and N11. The first transistor P11 may be a PMOS transistor which receives the first switching signal SW_s1 at its gate and the external voltage VDD at its source. The second transistor N11 may be a NMOS transistor which receives the first switching signal SW_s1 at its gate, is coupled to the drain of the first transistor P11 at its drain and is coupled to the ground voltage VSS at its source. Here, the signal line S_line may be coupled to a node to which the first and second transistors P11 and N11 are coupled and the transmitter output signal Tx_out may be transmitted to the receiver unit 300 through the signal line S_line.

The second signal level switching unit 310 may invert the transmitter output signal Tx_out and output the inverted transmitter output signal Tx_out as the second switching signal SW_s2 when the switching control signal SW_ctrl is enabled. The second signal level switching unit 310 may output the transmitter output signal Tx_out without inversion as the second switching signal SW_s2 when the switching control signal SW_ctrl is disabled.

The second signal level switching unit 310 may include third and fourth inverters IV13 and IV14 and a second switch 311. The third inverter IV13 may receive the transmitter output signal Tx_out. The second switch 311 may be coupled between input and output terminals of the third inverter IV14 and may transfer transmitter output signal Tx_out to the fourth inverter IV14 when the second switch 311 is turned on. The fourth inverter IV14 may receive a signal of a node to which the output terminal of the third inverter IV13 and an output terminal of the second switch 311 are commonly coupled and output the signal as the second switching signal SW_s2.

The receiver 320 may receive the second switching signal SW_s2 and output the receiver output signal Rx_out.

The semiconductor apparatus with such a configuration as described above may perform an operation as described below.

The first and second transistors P11 and N11 included in the driver 220 of FIG. 3 may be formed in the same fabrication process as the first and second transistors P1 and N1 included in the signal level switching decision unit 100 of FIG. 2. Therefore, the first and second transistors P11 and N11 included in the driver 220 and the first and second transistors P1 and N1 included in the signal level switching decision unit 100 may be formed under the same PVT condition and thus may have the same characteristics. In other words, the first and second transistors P11 and N11 included in the driver 220 of FIG. 3 may be copied from the first and second transistors P1 and N1 included in the signal level switching decision unit 100.

Drivability of the driver 220 may be designed to be high if the signal line S_line is long. Drivability of the driver 200 may be determined depending on drivability of the transistor therein. The drivability may be determined based on how much current the transistor can flow between its drain and source.

Even if the first and second transistors P11 and N11 included in the driver 220 are intended to minimize off-current in a standby mode, it may be difficult due to a process, voltage and temperature (PVT) variation.

The first and second transistors P1 and N1 included in the signal level switching decision unit 100 may be formed in the same fabrication process as the first and second transistors P11 and N11 included in the driver 220.

An operation of the signal level switching decision unit 100 is described below in detail with reference to FIG. 2.

When current flowing through the first transistor P1 is greater than current flowing through the second transistor N1, the voltage level of the output node N_out may increase. By contrast, when current flowing through the first transistor P1 is smaller than current flowing through the second transistor N1, the voltage level of the output node N_out may decrease.

The voltage level of the output node N_out may become the voltage level of the comparison voltage V_com.

Therefore, the comparison unit 120 may enable or disable the switching control signal SW_ctrl according to whether the voltage level of the comparison voltage V_com is higher or lower than the voltage level of the reference voltage Vref. For example, the comparison unit 120 may enable the switching control signal SW_ctrl when the voltage level of the comparison voltage V_com is higher than the voltage level of the reference voltage Vref. The comparison unit 120 may disable the switching control signal SW_ctrl when the voltage level of the comparison voltage V_com is lower than the voltage level of the reference voltage Vref.

In other words, the signal level switching decision unit 100 may enable the switching control signal SW_ctrl when current flowing through the first transistor P1 is greater than current flowing through second transistor N1. The signal level switching decision unit 100 may disable the switching control signal SW_ctrl when current flowing through the first transistor P1 is smaller than current flowing through the second transistor N1.

If off-current of the first transistor P1 is larger than that of the second transistor N1, the switching control signal SW_ctrl is enabled. If it is assumed that the transmitter input signal Tx_in has a high level, the first signal level switching unit 210 may invert the transmitter input signal Tx_in and output the inverted transmitter input signal Tx_in as the first switching signal SW_s1 when the switching control signal SW_ctrl is enabled. As a result, the driver 220 turn on the first transistor P11 and turn off the second transistor N11. If off-current of the first transistor P1 is smaller than that of the second transistor N1, the switching control signal SW_ctrl is disabled. If it is assumed that the transmitter input signal Tx_in has a high level, the first signal level switching unit 210 may output the transmitter input signal Tx_in without inversion as the first switching signal SW_s1 when the switching control signal SW_ctrl is disabled. As a result, the driver 220 turn off the first transistor P11 and turn on the second transistor N11.

The transmitter unit 200 including the first signal level switching unit 210 and the driver 220 may invert the transmitter input signal Tx_in and output the inverted transmitter input signal Tx_in as the transmitter output signal Tx_out or may output the transmitter input signal Tx_in without inversion as the transmitter output signal Tx_out in response to the switching control signal SW_ctrl.

Like the first signal level switching unit 210, the second signal level switching unit 310 may invert the transmitter output signal Tx_out and output the inverted transmitter output signal Tx_out as the second switching signal SW_s2 or may output the transmitter output signal Tx_out without inversion as the second switching signal SW_s2 in response to the switching control signal SW_ctrl. In other words, the second signal level switching unit 310 may invert an input signal and output the inverted input signal when the first signal level switching unit 210 inverts an input signal and output the inverted input signal. The second signal level switching unit 310 may output the input signal without inversion when the first signal level switching unit 210 outputs the input signal without inversion.

The receiver unit 300 including the second signal level switching unit 310 and the receiver 320 may invert the transmitter output signal Tx_out and output the inverted transmitter output signal Tx_out as the receiver output signal Rx_out or may output the transmitter output signal Tx_out without inversion as the receiver output signal Rx_out in response to the switching control signal SW_ctrl.

To sum up, where the first transistor P1 of the signal level switching decision unit 100 is the same as the first transistor P11 of the driver 220 in off-current characteristics and the second transistor N1 of the signal level switching decision unit 100 is the same as the second transistor N11 of the driver 220 in off-current characteristics, if off-current of the first transistor P1 is larger than that of the second transistor N1, the driver 220, which may cause large off-current, turns off the second transistor N11 whose off-current is relatively small and turns on the first transistor P11. If off-current of the second transistor N1 is larger than that of the first transistor P1, the driver 220 turns off the first transistor P11 whose off-current is relatively small and turns on the second transistor N11. In addition, both of the transmitter unit 200 and the receiver unit 300 may invert an input signal and output the input signal or may output the input signal without inversion in response to the switching control signal SW_ctrl. Therefore, when the transmitter input signal Tx_in is transferred through the transmitter unit 200 and the receiver unit 300 and output as the receiver output signal Rx_out, the transmitter input signal Tx_in and the receiver output signal Rx_out may maintain their relationship, and thus the receiver unit 300 may recover original data.

Figure 4:
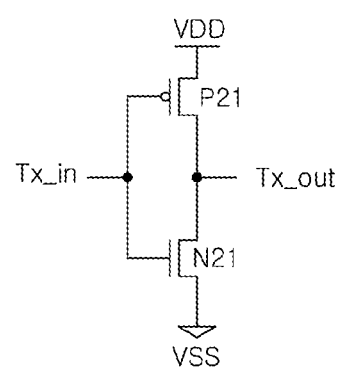
FIG. 4 is a block diagram illustrating a general driver.

Referring to FIG. 4, a general driver 10 comprises a PMOS transistor P21 and a NMOS transistor N21. It is assumed that the driver 10 in the standby mode outputs the high level of the transmitter output signal Tx_out.

When the level of the transmitter output signal Tx_out is a high level, the PMOS transistor P21 is turned on and the NMOS transistor N21 is turned off. As stated above, even when a transistor is in an "off" state, leakage current may occur. This leakage current may be referred to as off-current. It is assumed that, when each of the PMOS transistor P21 and the NMOS transistor N21 is turned off, off-current of the NMOS transistor N21 is greater than off-current of the PMOS transistor P21. In this case, total off-current that may be generated when the PMOS transistor P21 is turned on and the NMOS transistor N21 is turned off is larger than total off-current that may be generated when the PMOS transistor P21 is turned off and the NMOS transistor N21 is turned on. The off-current may increase power consumption because the driver 10 in the standby mode consumes a great amount of current.

However, in the semiconductor apparatus in accordance with an embodiment of the present invention, a signal to be input to the driver 220 may be inverted to be input to the driver 220. Therefore, the driver 220 may output the low level of the transmitter output signal Tx_out instead of high level. When the driver 220 outputs the low level of the transmitter output signal Tx_out, the first transistor P11 may be turned off and the second transistor N11 may be turned on. In other words, because the first transistor P11 having relatively small off-current is turned off, total amount of the off-current may decrease as compared to the off-current occurring when the second transistor N11 having relatively large off-current is turned off. Therefore, the off-current of the driver 220 may decrease, as compared to the general driver 10. In the standby mode, the transmitter unit 200 including the driver 220 may reduce current consumption, as compared to the general driver 10.

If it is assumed that the PMOS transistor P21 has a threshold voltage that is not enough to minimize off-current and the NMOS transistor N21 has a threshold voltage that is high enough to minimize off-current in the standby mode, the off-current may be minimized when the driver 10 in the standby mode outputs the high level of the transmission output signal Tx_out by turning on the PMOS transistor P21 and turning off the NMOS transistor N21 because the NMOS transistor N21 has a threshold voltage that is high enough to minimize off-current.

According to an embodiment of the present invention, when the first transistor P11 has a threshold voltage that is not enough to minimize off-current and the second transistor N11 has a threshold voltage that is high enough to minimize off-current, the input signal of the driver 220 which is the first switching signal SW_s1 may be inverted and input to the driver 220. Therefore, the first transistor P11 is turned on and the second transistor N11 is turned off, thereby reducing off-current.

Even though an example provided above shows that a driver in a standby mode outputs a high level of a output signal, the driver may be designed to output a low level of a output signal in a standby mode.

While certain embodiments have been described above, it will be understood to those skilled in the art that these embodiments have been described for illustrative purposes. Accordingly, the semiconductor apparatus described herein should not be limited to the described embodiments. Rather, the semiconductor apparatus described herein should be understood in light of the following claims when taken in conjunction with the above description and accompanying drawings.

What is claimed is:

1. A semiconductor apparatus comprising:
   a signal level switching decision unit configured to generate a switching control signal according to off-current of different type of transistors included therein;
   a transmitter unit configured to output one of a transmitter input signal and an inverted transmitter input signal as a transmitter output signal in response to the switching control signal, and
   a receiver unit configured to output the transmitter output signal as a receiver output signal,
   wherein the receiver unit inverts the transmitter output signal and outputs the inverted transmitter output signal as the receiver output signal when the switching control signal is enabled and outputs the transmitter output signal without inversion as the receiver output signal when the switching control signal is disabled.

2. The semiconductor apparatus of claim 1, wherein the signal level switching decision unit comprises:
   a comparison voltage generation unit configured to generate a comparison voltage according to off-current of transistors included therein; and
   a comparison unit configured to compare a voltage level of the comparison voltage with a reference voltage and generate the switching control signal.

3. The semiconductor apparatus of claim 2, wherein the comparison voltage generation unit comprises:
   a first transistor configured to pull up an output node according to a threshold voltage thereof; and
   a second transistor configured to pull down the output node according to a threshold voltage thereof,
   wherein the comparison voltage generation unit generates the comparison voltage at the output node.

4. The semiconductor apparatus of claim 3, wherein the signal level switching decision unit generates, if the first transistor has larger off-current than the second transistor, a high voltage by pulling up a voltage level of the output node, and generates, if the first transistor has smaller off-current than the second transistor, a low voltage by pulling down the voltage level of the output node.

5. The semiconductor apparatus of claim 4, wherein the first transistor is a PMOS transistor and the second transistor is a NMOS transistor, and wherein the first and second transistors have diode connections and coupled in serial between an external voltage and a ground voltage.

6. The semiconductor apparatus of claim 4, wherein the transmitter unit comprises a third transistor which is the same type of the first transistor and a fourth transistor which is the same type of the second transistor, and wherein the transmitter unit turns off the fourth transistor when the signal level switching decision unit generates the high voltage and turns off the third transistor when the signal level switching decision unit generates the low voltage.

7. The semiconductor apparatus of claim 1, wherein the transmitter unit inverts the transmitter input signal and outputs the inverted transmitter input signal as the transmitter output signal when the switching control signal is enabled and outputs the transmitter input signal without inversion as the transmitter output signal when the switching control signal is disabled.

8. The semiconductor apparatus of claim 7, wherein the transmitter unit comprises:
a signal level switching unit configured to selectively invert the transmitter input signal and output a switching signal in response to the switching control signal; and
a driver configured to drive the switching signal and output the transmitter output signal.

9. The semiconductor apparatus of claim 1, wherein the receiver unit comprises:
a signal level switching unit configured to selectively invert the transmitter output signal and output a switching signal in response to the switching control signal; and
a receiver configured to receive the switching signal and output the receiver output signal.

10. A semiconductor apparatus comprising:
a driver comprising a first transistor and a second transistor;
a signal level switching decision unit comprising a third transistor and a fourth transistor and configured to compare off-current of the third transistor and the fourth transistor and generate a switching control signal;
a first signal level switching unit configured to selectively invert a transmitter input signal in response to the switching control signal,
a second signal level switching unit configured to selectively invert a output signal of the driver in response to the switching control signal; and
a receiver configured to receive an output of the second signal level switching unit and output the output of the second signal level switching unit as a receiver output signal,
wherein the third transistor and the fourth transistor are different type of transistors from each other,
wherein the first and second transistors included in the driver and the third and fourth transistors included in the signal level switching decision unit are formed so that the first, second, third and fourth transistors have the same characteristics under the same PVT (process, voltage, temperature) condition.

11. The semiconductor apparatus of claim 10, wherein the first transistor and the third transistor are PMOS transistors, the second transistor and the fourth transistor are NMOS transistors.

12. The semiconductor apparatus of claim 11, wherein the driver comprises:
the first transistor configured to receive a first switching signal at a gate thereof and receive an external voltage at a source thereof; and
the second transistor configured to receive the first switching signal at a gate thereof, be coupled to a drain of the first transistor at a drain thereof, and receive a ground voltage at a source thereof,
wherein the driver outputs transmitter output signal at a node to which the first transistor and the second transistor are coupled.

13. The semiconductor apparatus of claim 11, wherein the signal level switching decision unit comprises:
the third transistor configured to pull up an output node according to a threshold voltage thereof;
the fourth transistor configured to pull down the output node according to a threshold voltage thereof; and
a comparison unit configured to compare a voltage level of the output node with a reference voltage and generate the switching control signal.

14. The semiconductor apparatus of claim 13, wherein the third transistor receives an external voltage at a source thereof and is coupled to the output node at a gate and a drain thereof, and
wherein the fourth transistor is coupled to the output node at a gate and a drain thereof and coupled to a ground voltage at a source thereof.

15. A semiconductor apparatus comprising:
a first signal level switching unit configured to output a transmitter input signal as a first switching signal in response to a switching control signal;
a driver configured to drive the first switching signal and output the first switching signal as a transmitter output signal;
a second signal level switching unit configured to output the transmitter output signal as a second switching signal in response to the switching control signal; and
a receiver configured to receive the second switching signal and output the second switching signal as a receiver output signal,
wherein the second signal level switching unit inverts the transmitter output signal and outputs the inverted transmitter output signal as the second switching signal in response to the switching control signal when the first signal level switching unit inverts the transmitter input signal and outputs the inverted transmitter input signal as the first switching signal in response to the switching control signal, and
wherein the second signal level switching unit outputs the transmitter output signal without inversion as the second switching signal in response to the switching control signal when the first signal level switching unit outputs the transmitter input signal without inversion as the first switching signal in response to the switching control signal.

16. The semiconductor apparatus of claim 15, further comprising a signal level switching decision unit configured to compare drivability of each of a PMOS transistor and a NMOS transistor included in the driver and generate the switching control signal.

17. The semiconductor apparatus of claim 16, wherein the signal level switching decision unit comprises:

a first transistor configured to have the same characteristics as the PMOS transistor;
a second transistor configured to have the same characteristics as the NMOS transistor; and
a comparison unit,
wherein the first transistor pulls up an output node according to a threshold voltage thereof,
wherein the second transistor pulls down the output node according to a threshold voltage thereof, and
wherein the comparison unit compares a voltage level of the output node with a reference voltage and generate the switching control signal.

* * * * *